US006493258B1

(12) United States Patent
Lu et al.

(10) Patent No.: US 6,493,258 B1
(45) Date of Patent: Dec. 10, 2002

(54) MAGNETO-RESISTIVE MEMORY ARRAY

(75) Inventors: Yong Lu, Plymouth; Theodore Zhu; Romney R. Katti, both of Maple Grove, all of MN (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/618,237

(22) Filed: Jul. 18, 2000

(51) Int. Cl.$^7$ ............................................. G11C 11/00
(52) U.S. Cl. ........................ 365/158; 365/157; 365/171; 365/173
(58) Field of Search ........................ 365/158, 173, 365/171, 157, 50, 52, 55, 66, 230.08, 232

(56) References Cited

U.S. PATENT DOCUMENTS

| | | |
|---|---|---|
| 3,573,485 A | 4/1971 | Ballard |
| 4,132,904 A | 1/1979 | Harari |
| 4,553,053 A | 11/1985 | Ong et al. |
| 4,731,757 A | 3/1988 | Daughton et al. |
| 4,751,677 A | 6/1988 | Daughton et al. |
| 4,829,476 A | 5/1989 | Dupuis et al. |
| 4,887,236 A | 12/1989 | Schloemann |
| 5,349,302 A | 9/1994 | Cooper |
| 5,361,226 A | 11/1994 | Taguchi et al. |
| 5,434,826 A | 7/1995 | Ravipati et al. |
| 5,515,314 A | 5/1996 | Kouhei et al. |
| 5,587,943 A | 12/1996 | Torok et al. |
| 5,595,830 A | 1/1997 | Daughton |
| 5,640,343 A | 6/1997 | Gallagher et al. |
| 5,650,887 A | 7/1997 | Dovek et al. |
| 5,650,958 A | 7/1997 | Gallagher et al. |
| 5,654,566 A | 8/1997 | Johnson |
| 5,695,864 A | 12/1997 | Slonczewski |
| 5,701,222 A | 12/1997 | Gill et al. |
| 5,701,223 A | 12/1997 | Fontana, Jr. et al. |
| 5,748,519 A | 5/1998 | Tehrani et al. |
| 5,776,537 A | 7/1998 | Ryan et al. |
| 5,801,529 A | 9/1998 | Umemoto et al. |
| 5,838,608 A  * | 11/1998 | Zhu et al. .................... 365/158 |
| 5,861,328 A | 1/1999 | Tehrani et al. |
| 5,946,227 A  * | 8/1999 | Naji .......................... 365/158 |

FOREIGN PATENT DOCUMENTS

| | | | |
|---|---|---|---|
| EP | 0 776 011 A2 | 5/1997 | |
| JP | 409237410 A  * | 9/1997 | ............ G11B/5/39 |
| WO | WO 98/20496 | 5/1998 | |

OTHER PUBLICATIONS

B Razavi and B.A. Wooley, "Design Techniques for High Speed, High Resolution Comparators", *IEEE Journal of Solid State Circuits*, vol. 27, pp. 1916–1926, Dec. 1992.

* cited by examiner

Primary Examiner—David Nelms
Assistant Examiner—David Lam
(74) Attorney, Agent, or Firm—Knobbe, Martens, Olson & Bear, LLP

(57) ABSTRACT

A low power, high speed magneto-resistive memory is disclosed. The disclosed memory directly senses the resistive state of one or more magneto-resistive memory elements. This allows the memory to be read during a single read cycle, without the need for a word line current. This may substantially increase the speed and reduce the power of the memory.

26 Claims, 13 Drawing Sheets

Prior Art

MAGNETO-RESISTIVE MEMORY ARRAY

CROSS-REFERENCE TO RELATED APPLICATIONS

This Application is related to U.S. Patent application Ser. No. 09/618256 filed Jul. 17, 2000, and entitled "MAGNETO-RESISTIVE MEMORY HAVING SENSE AMPLIFIER WITH OFFSET CONTROL", and U.S. Patent application Ser. No. 09/638415 filed Aug. 14, 2000, and entitled "MAGNETO-RESISTIVE MEMORY WITH SHARED WORD LINE AND SENSE LINE", both of which are incorporated herein by reference.

BACKGROUND OF THE INVENTION

The present invention relates to ferromagnetic thin film memories and, more particularly, to ferromagnetic thin film memories in which states of the memory cells based on magnetization direction are determined through magnetoresistive properties of the thin film sensed by an electronic circuit.

Digital memories of various kinds are used extensively in computers and computer system components, in digital processing systems, and the like. Such memories can be formed, to considerable advantage, based on the storage of digital bits as alternative states of magnetization in magnetic materials in each memory cell, typically thin film materials. These films may be ferromagnetic thin films having information stored therein through the direction of the magnetization occurring in that film, with this information being obtained through either inductive sensing to determine the magnetization state, or by magnetoresistive sensing of such states. Such ferromagnetic thin film memories may be conveniently provided on the surface of a monolithic integrated circuit to provide easy electrical interconnection between the memory cells and the memory operating circuitry.

Ferromagnetic thin film memory cells can be made very small and packed very closely together to achieve a significant density of stored digital bits, properties which permit them to be provided on the surface of a monolithic integrated circuit as indicated above. One construction, as an example, is shown in FIG. 1, where a bit structure 10 for a memory cell that is presented is formed over a semiconductor material body 12, as used in a monolithic integrated circuit, and directly on an insulating layer 13, itself supported on a major surface of body 12 in the integrated circuit. Only a small portion of the integrated circuit is shown, and then only a small portion of the semiconductor body is shown in that integrated circuit portion.

These bit structures in an assemblage in a memory are usually provided in a series string of such bit structures often collectively called a sense line. There are typically a plurality of such sense lines in a memory. In order to make interconnections between members of such sense lines, or between the sense lines and the external circuitry in the integrated circuit for operating the memory, terminal regions or junctures 14 are typically provided at each end of the bit structure for interconnection purposes. These interconnections might be formed of copper alloyed in aluminum.

The remainder of the bit structure disposed on the exposed major surface of insulating layer 13 includes a lower ferromagnetic thin film 15 and an upper ferromagnetic thin film 16. Ferromagnetic thin film layers 15 and 16 typically exhibit uniaxial anisotropy, magnetoresistance, little magnetostriction, and are of an alloy composition typically comprising nickel, cobalt and iron. The magnetic device structure can be a spin valve that includes a pinned reference layer 15 spaced apart from a "free layer" 16 that stores the digital information. The lower ferromagnetic thin film 15 is typically, but not always, thicker than the upper ferromagnetic thin film 16. Alternatively, a pseudo-spin-valve structure can be used where the lower ferromagnetic thin film 15 is often called the hard layer, and the upper ferromagnetic thin film 16 is often called the soft layer.

Between ferromagnetic thin film layers 15 and 16 is typically a further thin layer 17 which usually would not exhibit ferromagnetism but may be either an electrical conductor or an electrical insulator. Layer 17 must, however, in this construction, minimize the exchange interaction between layers 15 and 16 so that the magnetization vectors of each layer are decoupled. A typical choice for layer 17 would be copper. An insulating layer 18 covers bit structure 10 although only a part of it is shown in FIG. 1.

Finally, a word line 19 is shown in FIG. 1 disposed on the major surface of insulating layer 18. Word line 19 typically includes an aluminum layer alloyed with copper on a titanium-tungsten base layer. A protective and insulating layer over the entire structure of FIG. 1 is often used in practice, but is not shown here.

Bit structure 10 can be operated in a longitudinal mode having its easy axis extend between internal interconnections 14 perpendicular to the direction of word line 19. Information kept as a digital bit having one of two alternative logic values in bit structure 10 is stored therein in layer 15 by having the magnetization vector point in one direction or the other, generally along the easy axis of magnetization. If the direction of magnetization is caused to rotate from such a direction by external magnetic fields, the electrical resistance of layers 15 and 16 changes with this magnetization direction rotation because of the magnetoresistive properties of such layers. For the kinds of materials typically used in layers 15 and 16, the maximum change in resistance is on the order of a few percent of the minimum resistance value.

In the memory shown in FIG. 1, sense current refers to the current flow through bit structure 10 from one terminal 14 to the other terminal 14. Word current refers to current flow in word line 19 adjacent to, and transverse to the orientation of bit structure 10. Bit structure 10 can be placed in one of the two possible magnetization states of layer 15 (pinned layer) through the selective application of sense and word currents i.e., information can be "written" in bit structure 10. A bit structure 10 of a typical memory configuration can be placed in a "0" magnetization state by the application of a sense current of typically 1.0 mA, and coincidentally with the provision of a word current in one direction from 20 mA to 40 mA. The opposite magnetization state representing a "1" logic value can be provided through providing the same sense current and a word current of the same magnitude in the opposite direction. Such states typically occur fairly quickly after the proper current levels are reached, such state changes typically occurring in less than about 5 ns.

Determining which magnetization state is stored in bit structure 10 i.e., reading the information stored in bit structure 10, is typically done by providing externally caused magnetic fields in that bit structure, through providing, for example, word line currents and coincident sense line currents. These currents rotate the magnetization of the upper ferromagnetic thin film 16 (free layer) of the bit structure 10. As indicated above, this causes a change in the electrical resistance encountered between terminal regions 14 in bit structure 10 for different magnetization directions in the structure, including changing from one easy axis direction magnetization state to the opposite direction state. As a result, there is detectable differences in the voltage developed across magnetic bit structure 10 by the sense current flowing therethrough, depending on the relative magnetization direction of the pinned and free layers of bit structure 10.

During a typical read procedure, a word line current is provided over a selected bit structure 10 in a first direction. The word line current produces an externally generated magnetic field in the bit structure 10. The magnitude of the word line current must be large enough to rotate the free layer 15 of the bit structure 10. A typical word line current is 10–20 mA.

A sense current is also provided to the sense line that includes the bit structure 10. Because each sense line typically includes a series string of bit structures, the sense current typically flows through all of the bit structures that are members of the selected sense line. The sense current is typically provided concurrent with the word line current, and the resulting voltage (resistance) across the sense line is sensed. If the magnetization of the free layer 16 is parallel to the magnetization of the pinned layer 15, the voltage (resistance) is in a lower state. If the magnetization of the free layer 16 is anti-parallel to the magnetization of the pinned layer 15, the voltage (resistance) is in a higher state. The sensed voltage (resistance) is then typically stored using an auto-zero circuit. The time required to sense the voltage (resistance) of the members in the sense line, including bit structure 10, is typically about 50 ns. This time is relatively long, at least in part, because of the noise generated by the relatively large word line current that is present during the sensing operation.

After the voltage (resistance) of the sense line is sensed with the word line current in the first direction, the word line current is typically reversed. The magnitude of the word line current is again large enough to rotate the free layer 15 of the bit structure 10. A sense current is then provided to the sense line that includes bit structure 10, concurrent with the word line current, and the resulting voltage (resistance) across the members of the sense line is again sensed. The time typically required to sense the voltage (resistance) of the sense line is about 50 ns. The sensed voltage (resistance) is then compared to the previously sensed voltage (resistance) stored by the auto-zero circuit. If the resistance change is positive, one logic state is read. If the resistance change is negative, the opposite logic state is read.

The above-described reading procedure suffers from a number of disadvantages. One disadvantage is that two separate read cycles are required to read the state of a memory element; one with the word line current in one direction and another with the word line current in the opposite direction. Because two read cycles are required, the read access time of the memory can be limited.

Another disadvantage of the above-described reading procedure is that the voltage (resistance) sensed during the first cycle is relatively close in value to the voltage (resistance) sensed during the second cycle. This is because the reading procedure senses the resistance of all of the bit structures in the sense line, and not just the desired bit structure 10. As indicated above, the maximum change in resistance for a typical magneto-resistive bit structure 10 is on the order of a few percent of the minimum resistance value. While this resistance change is already relatively small, the percentage resistance change is effectively reduced by the resistance of the other bit structures that are in the selected sense line. As a result, it can be difficult and time consuming to compare the two resistance values to determine the state of the selected bit structure 10. This can increase the read access time and reduce the reliability of the memory.

Another disadvantage of the above-described reading procedure is that a relatively large word line current (10–30 mA) must typically be provided throughout each sensing cycle. This is particularly problematic because each sensing cycle may take on the order of 50 ns to sense the voltage (resistance) of the bit structure 10. As such, the reading operation may consume a significant amount of power. A related limitation is that the relatively large word line current can also cause a significant amount of noise at the bit structure 10. This can reduce the signal-to-noise ratio on the sense lines and slow the sensing operation.

SUMMARY OF THE INVENTION

The present invention overcomes many of the disadvantages of the prior art by providing a magneto-resistive memory that can directly sense the resistive state of one or more magneto-resistive memory elements, and therefore does not require two separate read cycles to read the state of a memory cell. This increases the speed and reduces the power of the memory. In addition, a word line current is not required to read a desired magneto-resistive memory element. This also helps increase the speed and reduce the power of the memory.

In one illustrative embodiment of the present invention, the magneto-resistive memory includes an array of memory cells arranged into rows and columns, with each column having a bit line. Each memory cell preferably includes a magneto-resistive bit, with the first end of the magneto-resistive bit connected to the bit line. Each memory cell preferably also includes a switch that is coupled to the second end of the magneto-resistive bit for selectively providing a path for a sense current to flow from the bit line, through the selected magneto-resistive bit, and to a first predetermined voltage terminal such as ground.

To read a selected memory cell of the magneto-resistive memory, a sense current is provided to the bit line that is connected to the selected memory cell, and the switch in the selected memory cell is enabled. By activating the switch, the sense current provided on the corresponding bit line flows through the magneto-resistive bit of the selected memory cell and to a predetermined voltage (e.g. ground). The switch provides selectivity between the rows of memory cells in the magneto-resistive memory. In this configuration, the sense current produces a voltage on the corresponding bit line that reflects the resistive state of the magneto-resistive bit. A sense amplifier may then be used to sense the voltage on the bit line.

In another illustrative embodiment of the present invention, each column has two bit lines, and each memory cell has two magneto-resistive bits that are written into opposite resistive states. The first end of a first magneto-resistive bit is connected to a first bit line, and first end of a second magneto-resistive bit is connected to a second bit line. Each memory cell preferably also includes a switch that is coupled to the second end of the first magneto-resistive bit and the second end of the second magneto-resistive bit. The switch selectively provides a path for a first sense current to flow from the first bit line, through the first magneto-resistive bit, and to a predetermined voltage. The switch also may selectively provide a path for a second sense current to flow from the second bit line, through the second magneto-resistive bit, and to the predetermined voltage.

In this illustrative embodiment, a selected memory cell is read by providing a first sense current to the first bit line and a second sense current to the second bit line. The first sense current is preferably substantially identical to the second sense current. Then, the switch of the selected memory cell is enabled. This allows the first sense current to flow through the first magneto-resistive bit to produce a first voltage on the first bit line, and further allows the second sense current to flow through the second magneto-resistive bit to produce a second voltage on the second bit line. A sense amplifier may then be used to sense the differential voltage between the first bit line and the second bit line.

Once the magneto-resistive state of the selected memory cell is sensed, the sensed state may be stored in a storage element, such as a latch or register. In an illustrative embodiment, a latch is provided that includes a first inverter and a second inverter coupled together in a cross-coupled configuration. Each of the first and second inverters preferably has a positive supply terminal, a negative supply terminal, an input terminal and an output terminal. The positive supply terminal of the first and second inverters are preferably coupled to a power supply voltage, such as VDD. The latch may also include a load transistor for loading a state into the latch. The load transistor preferably has a source terminal coupled to the input terminal of the first inverter, a drain terminal coupled to the input terminal of the second inverter, and a gate terminal coupled to a load enable terminal.

In one illustrative embodiment, the first bit line is coupled to a first predetermined node of the first inverter, and the second bit line is connected to a second predetermined node of the second inverter. The first predetermined node and the second predetermined node are preferably either the input terminal or the negative supply terminal of the corresponding cross-coupled inverter.

Rather than coupling the first bit line and the second bit line directly to the predetermined nodes of the latch, it is contemplated that the first bit line and the second bit line may first be provided to a differential amplifier. The differential amplifier may amplify the differential signal between the first bit line and the second bit line before providing an amplified differential signal to the predetermined nodes of the latch. It is also contemplated that the differential voltage signal between the first and second bit lines, either amplified or not, may be coupled to the predetermined nodes of the latch via one or more switches, if desired, as further described below.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein.

DETAILED DESCRIPTION OF THE PREFERRED EMBODIMENTS

Figure 2:
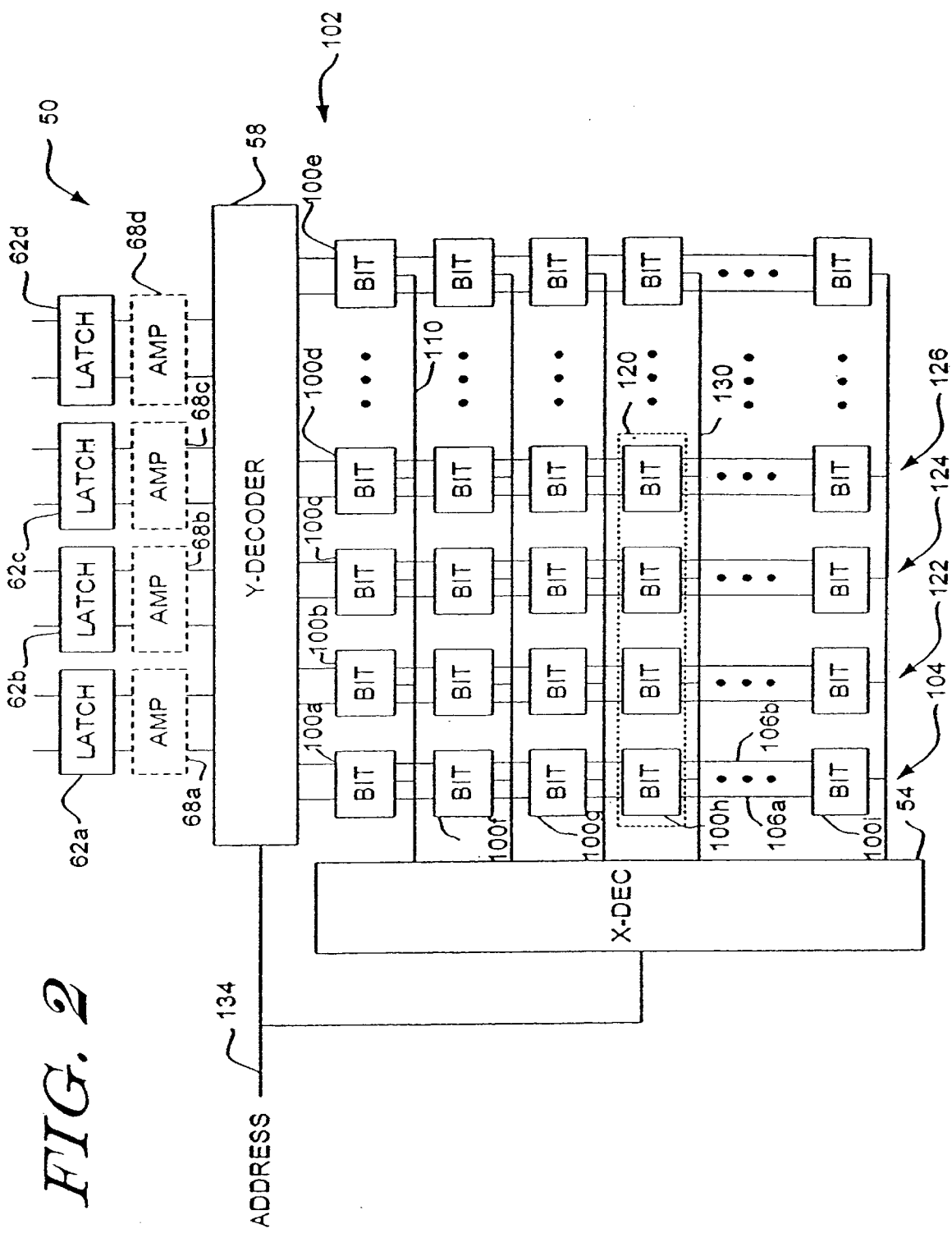
FIG. 2 is a schematic diagram showing an illustrative magneto-resistive memory in accordance with the present invention.

FIG. 2 is a schematic diagram showing an illustrative magneto-resistive memory in accordance with the present invention. The basic memory architecture is generally shown at 50 and includes an array of memory cells 100, a x-decoder 54, a y-decoder 58, one or more latches 62, and one or more sense amplifiers 68. The x-decoder 54, y-decoder 58 and sense amplifiers 68 are optional, at least for some embodiments.

The memory cells 100 are arranged into a number of rows and a number of columns. One row is shown at 102, and includes memory cells 100a, 100b, 100c, 100d and 100e. One column is shown at 104, and includes memory cells 100a, 100f, 100g, 100h and 100i. Each column has at least one, but preferably two, bit lines associated therewith. For example, column 104 has bit lines 106a and 106b. Likewise, each row preferably has at least one select line associated therewith. The select lines are preferably used to select a desired row of memory cells. For example, row 102 has select line 110.

The bit lines for each column of the memory array are preferably provided to y-decoder 58. Y-decoder 58 selects the bit line pairs of selected columns, and provides the selected bit line pairs to latch elements 62. In some embodiments, and as described below, the Y-decoder 58 provides the selected bit line pairs to latch elements 62 via amplifiers 68. The illustrative memory is a X4 configuration. Thus, the y-decoder 58 selects four bit line pairs, and couples the selected four bit line pairs to the four latch elements 62a, 62b, 62c and 62d. Likewise, the select lines for each row of memory cells are preferably provided to x-decoder 54. The x-decoder 54 preferably selects one row of memory cells. In the illustrative embodiment, the y-decoder 58 and the x-decoder 54 are controlled by a memory address 134.

In one embodiment, and to read the four bits identified at 120, the y-decoder 58 preferably couples the bit lines of columns 104, 122, 124 and 126 to latches 62a, 62b, 62c and 62d, respectively, and the x-decoder 54 asserts select line 130. This causes the each of the four bits 120 to be enabled, with the corresponding bit lines coupled to the four latches 62a, 62b, 62c and 62d.

It is recognized that in some embodiments, the y-decoder 58 may not be needed, and the bit line pairs may be directly coupled to a corresponding latch element. Likewise, the x-decoder 54 may not be needed, and the select line may be directly controlled by, for example, an address bit.

It is sometimes advantageous to provide a sense amplifier between the selected bit lines and the latch elements. In the illustrative diagram, the sense amplifiers are shown in dotted lines at 68a, 68b, 68c and 68d, indicating that they are optionally used in some embodiments. The sense amplifiers 68a, 68b, 68c and 68d amplify the signals on the bit lines before providing an amplified signal to the latches. This may be particularly beneficial when relatively small sense currents are provided to the magneto-resistive bits to save power. Illustrative sense amplifiers are shown and described below with respect to FIGS. 7–13.

Figure 3:
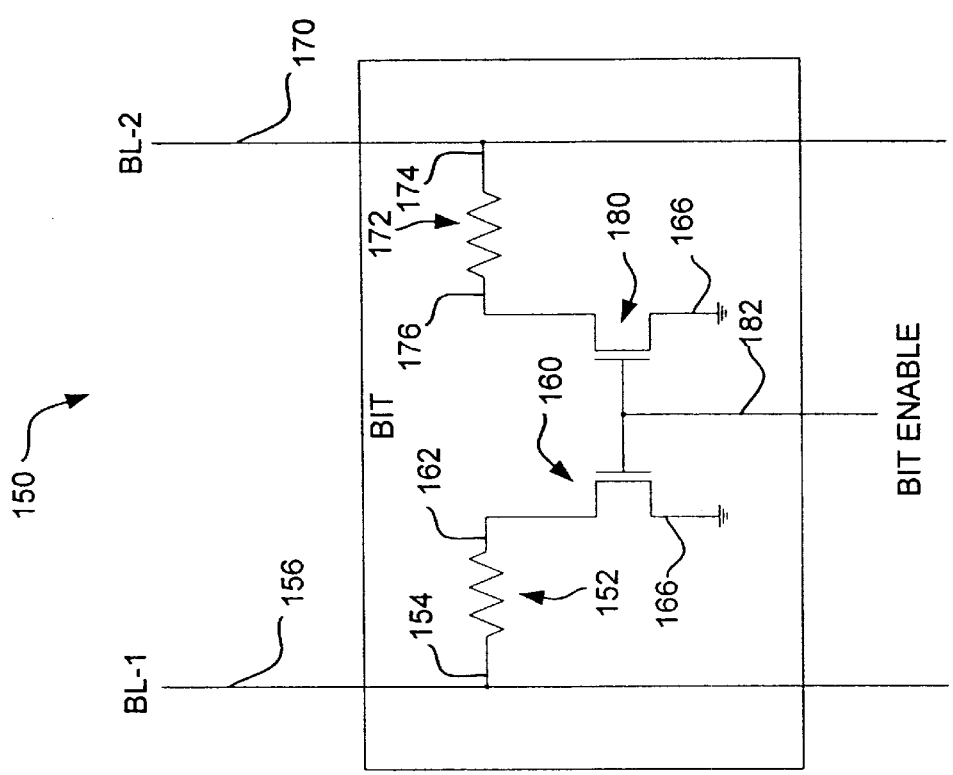
FIG. 3 is a schematic diagram showing an illustrative memory cell in accordance with the present invention.

FIG. 3 is a schematic diagram showing an illustrative memory cell in accordance with the present invention. The memory cell is generally shown at 150, and includes at least one magneto-resistive bit 152. A first end 154 of the magneto-resistive bit 152 is connected to a bit line 156. A switch 160 is coupled to the second end 162 of the magneto-resistive bit 152. The switch 160 selectively provides a path for a sense current to flow from the bit line 156, through at least part of the magneto-resistive bit 152, and to a first predetermined voltage terminal 166, such as ground. In the illustrative embodiment shown, the switch 160 is an n-channel transistor.

To read the memory cell 150, a sense current is provided to the bit line 156, and the switch 160 is enabled. By activating the switch 160, the sense current provided on bit line 156 flows through the magneto-resistive bit 152 and to the predetermined voltage terminal 166 (e.g. ground). The switch 160 provides selectivity between rows of memory cells in a magneto-resistive memory array, such as memory 50 shown in FIG. 2. The sense current produces a voltage on bit line 156 that reflects the resistive state of the magneto-resistive bit 152. A sense amplifier (see FIG. 2) may be used to sense and amplify the voltage on the bit line 156.

In another embodiment, the memory cell 150 may be coupled to two bit lines 156 and 170, and include two magneto-resistive bits 152 and 172 as shown. The magneto-resistive bits 152 and 172 are preferably written into opposite resistive states. Like above, the first end 154 of the first magneto-resistive bit 152 is connected to the first bit line 156. The first end 174 of the second magneto-resistive bit 172 is connected to the second bit line 170. The memory cell also includes a switch that is coupled to the second end 162 of the first magneto-resistive bit 152 and the second end 176 of the second magneto-resistive bit 172. The switch selectively provides a path for a first sense current to flow from the first bit line 156, through the first magneto-resistive bit 152, and to a predetermined voltage terminal 166. The switch also may selectively provide a path for a second sense current to flow from the second bit line 170, through the second magneto-resistive bit 172, and to the predetermined voltage terminal 166.

In this illustrative embodiment, the memory cell is read by providing a first sense current to the first bit line and a second sense current to the second bit line. The first sense current is preferably substantially identical to the second sense current. Thereafter, the switch of the selected memory cell is enabled. This allows the first sense current to flow through the first magneto-resistive bit 152 to produce a first voltage on the first bit line 156, and allows the second sense current to flow through the second magnet-oresistive bit 172 to produce a second voltage on the second bit line 170. In the illustrative embodiment shown, the switch includes a first n-channel transistor 160 and a second n-channel transistor 180, with the gates of the first and second n-channel transistors 160 and 180 connected to a bit enable terminal 182. A sense amplifier may then be used to sense and amplify a differential voltage between the first bit line 156 and the second bit lines 170.

It is contemplated that each of the memory cells of FIG. 2 may be implemented similar to that shown in FIG. 3. For example, if memory cell 100a of FIG. 2 is implemented similar to that shown in FIG. 3, the first bit line 156 and the second bit line 170 of FIG. 3 may correspond to bit lines 106a and 106b of FIG. 2. Likewise, the bit enable terminal 182 of FIG. 3 may be connected to the row select line 110 of FIG. 2.

Figure 4:
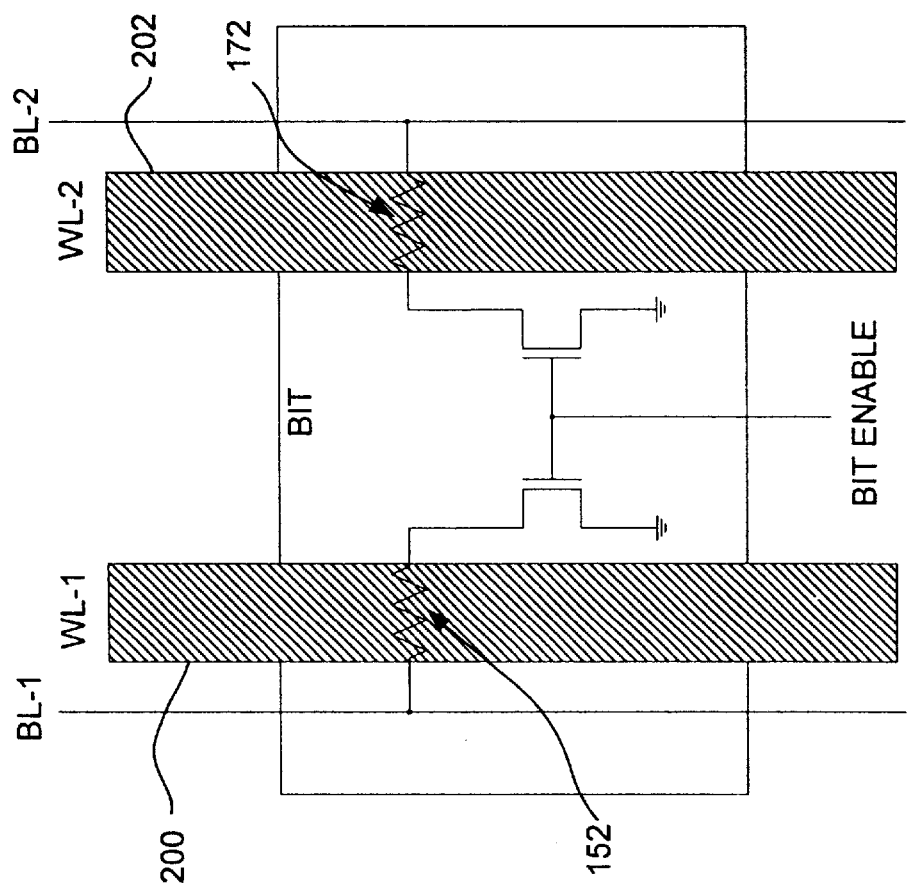
FIG. 4 is a schematic diagram showing the illustrative memory cell of FIG. 3, with two separate word lines overlaying the magneto-resistive bits.

FIG. 4 is a schematic diagram showing the illustrative memory cell of FIG. 3, with two separate word lines overlaying the magneto-resistive bits 152 and 172. As indicated above, the magneto-resistive bits 152 and 172 are preferably written into opposite resistive states. This may be accomplished in a variety of ways, including for example, providing a first word line 200 adjacent, and transverse to the orientation of, the first magneto-resistive bit 152, and a second word line 202 adjacent, and transverse to the orientation of, the second magneto-resistive bit 172.

If the magnetization vector of the pinned (or hard) layer of the magneto-resistive elements 152 and 172 points in a common direction, such as to the right, the magneto-resistive elements 152 and 172 can be written into opposite resistive states by providing a word line current down the first word line 200 and up the second word line 202, or up the first word line 200 and down the second word line 202, depending on the desired state to be written. If the magnetization vector of the pinned (or hard) layer of magneto-resistive element 152 points in an opposite direction to the pinned (or hard) layer of magneto-resistive element 172, a word line current may be provided down the first and second word lines 200 and 202, or up the first and second word lines 200 and 202, depending on the desired state to be written.

Figure 5:
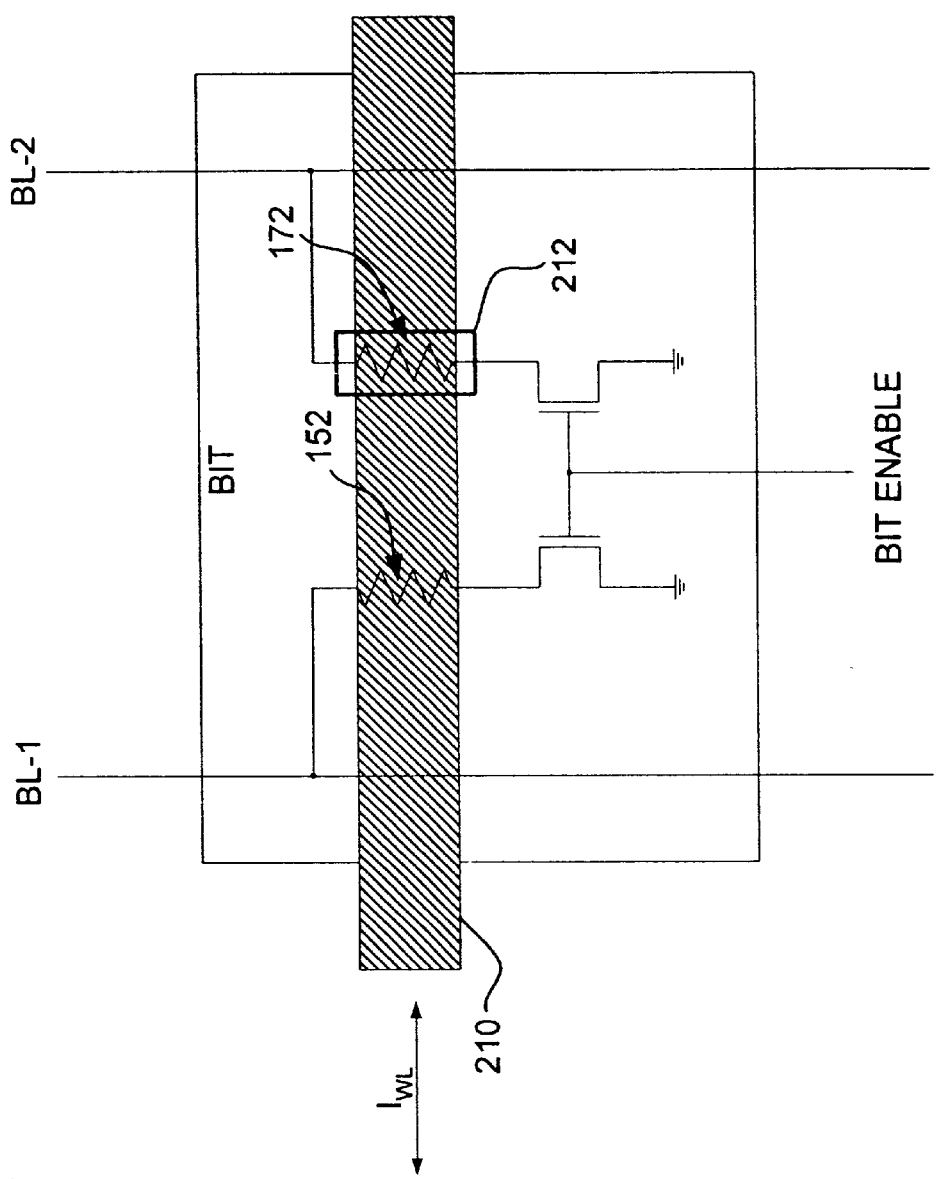
FIG. 5 is a schematic diagram showing the illustrative memory cell of FIG. 3, with one word lines passing over one of the magneto-resistive bits and under the other.

FIG. 5 is a schematic diagram showing the illustrative memory cell of FIG. 3, with a word line 210 extending over, and transverse to, the orientation of the first magneto-resistive bit 152, and under, and transverse to, the orientation of the second magneto-resistive bit 172. Box 212 indicates that the second magneto-resistive bit 172 is above word line 210.

In this configuration, the magnetization vectors of the pinned (or hard) layers of the magneto-resistive elements 152 and 172 preferably point in a common direction, such as in an upward or downward direction. A word line current provided through the word line 210 changes the magnetization vector of the free (or soft) layer of magneto-resistive bit 152 to point in one direction, and the free (or soft) layer of magneto-resistive bit 172 to point in the opposite direction. Accordingly, the first and second magneto-resistive bits 152 and 172 may be written into opposite resistive states.

Figure 6:
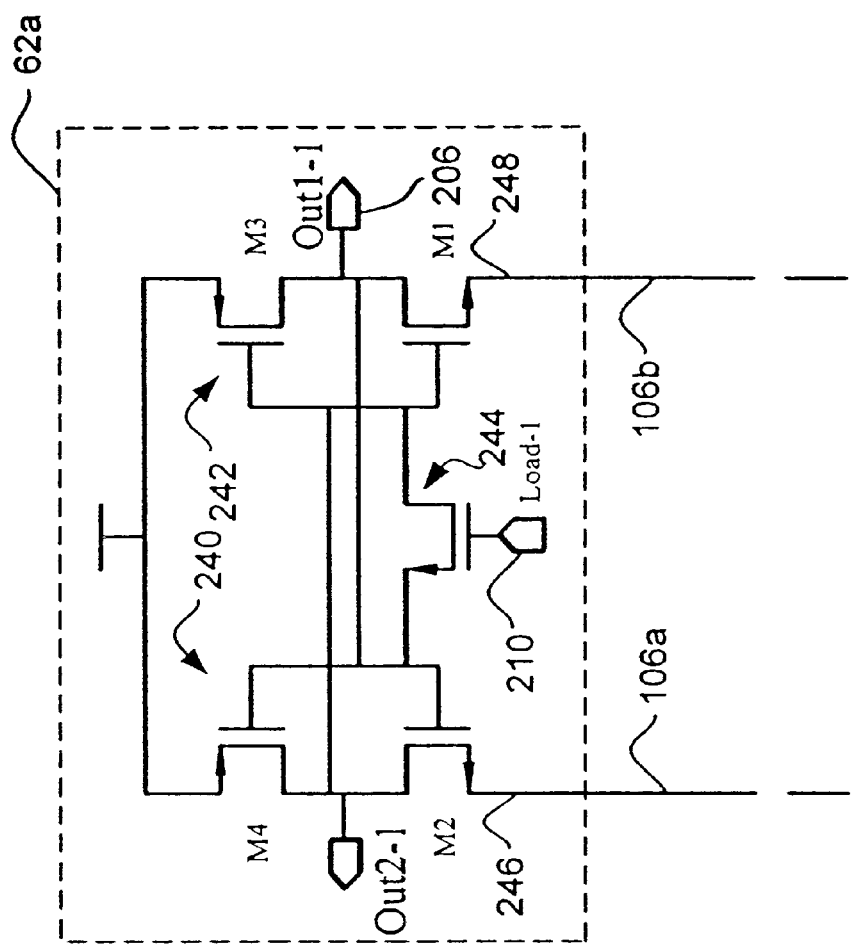
FIG. 6 is a schematic diagram of a first illustrative latch in accordance with the present invention.

FIG. 6 is a schematic diagram of a first illustrative latch in accordance with the present invention. The latch of FIG. 6 is one illustrative implementation for the latch elements 62a, 62b, 62c and 62d of FIG. 2. This implementation is typically used when the sense amplifiers 68a, 68b, 68c and 68d of FIG. 2 are not used. The illustrative latch 62a includes a first inverter 240 and a second inverter 242 coupled together in a cross-coupled configuration. The latch preferably includes a load transistor 244 coupled between the input (or output) terminals of the first and second inverters. The load transistor 244 is used to load the state present on the negative supply terminals 246 and 248 of the first and second inverters 240 and 242, respectively.

A first bit line, such as bit line 106a of FIG. 2, is coupled to the negative supply terminal 246 of the first inverter 240. Likewise, a second bit line, such as bit line 106b of FIG. 2, is coupled to the negative supply terminal 248 of the second inverter 242. When a particular memory cell is selected, a first end 154 of a first magneto-resistive bit 152 (see FIG. 3) is thus coupled to the negative supply terminal 246 of the first inverter 240 via the first bit line 106a, and a first end 174 of a second magneto-resistive bit 172 is coupled to the negative supply terminal 248 of the second inverter 242 via the second bit line 106b. During a read operation, the second ends 162 and 176 of the first and second magneto-resistive bits 152 and 172, respectively, are also coupled to ground via switches 160 and 180 or the like, as described above.

When the load transistor 244 of the latch is activated, identical sense line currents are provided to the first bit line 106a and the second bit line 106b via the negative supply terminals 246 and 248 of the first and second inverters 240 and 242. With the switches 160 and 180 in the memory cell enabled, for example via select-1 line 110 of FIG. 2, the first and second sense line currents pass through the first and second magneto-resistive bits 152 and 172, respectively, to ground. Since the first and second magneto-resistive bits 152 and 172 are in opposite resistive states, the voltages at the bit lines, and thus the negative supply terminals 246 and 248 of the latch, are not equal. When the load transistor 244 is deactivated, the latch circuit assumes the state that corresponds to the voltage differential between the negative supply terminals 246 and 248 of the first and second inverters 240 and 242. This state corresponds to the resistive state of the magneto-resistive bits 152 and 172.

Figure 1:
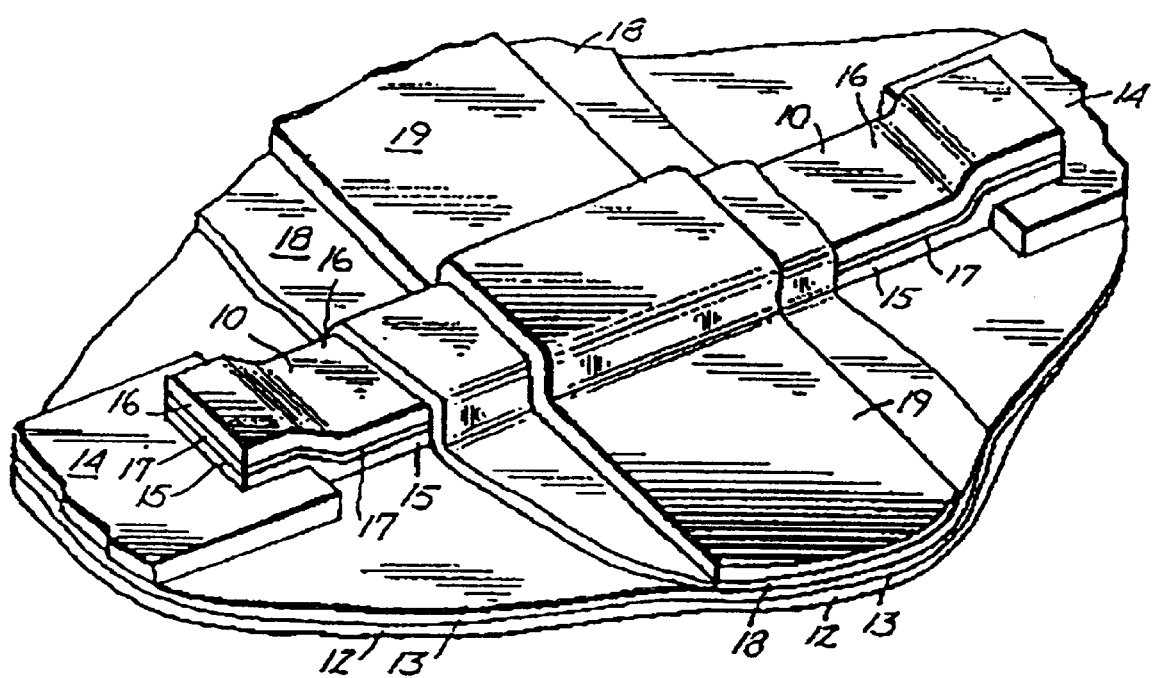
FIG. 1 is a partial cut-away perspective view of a prior art magneto-resistive memory.
Figure 7:
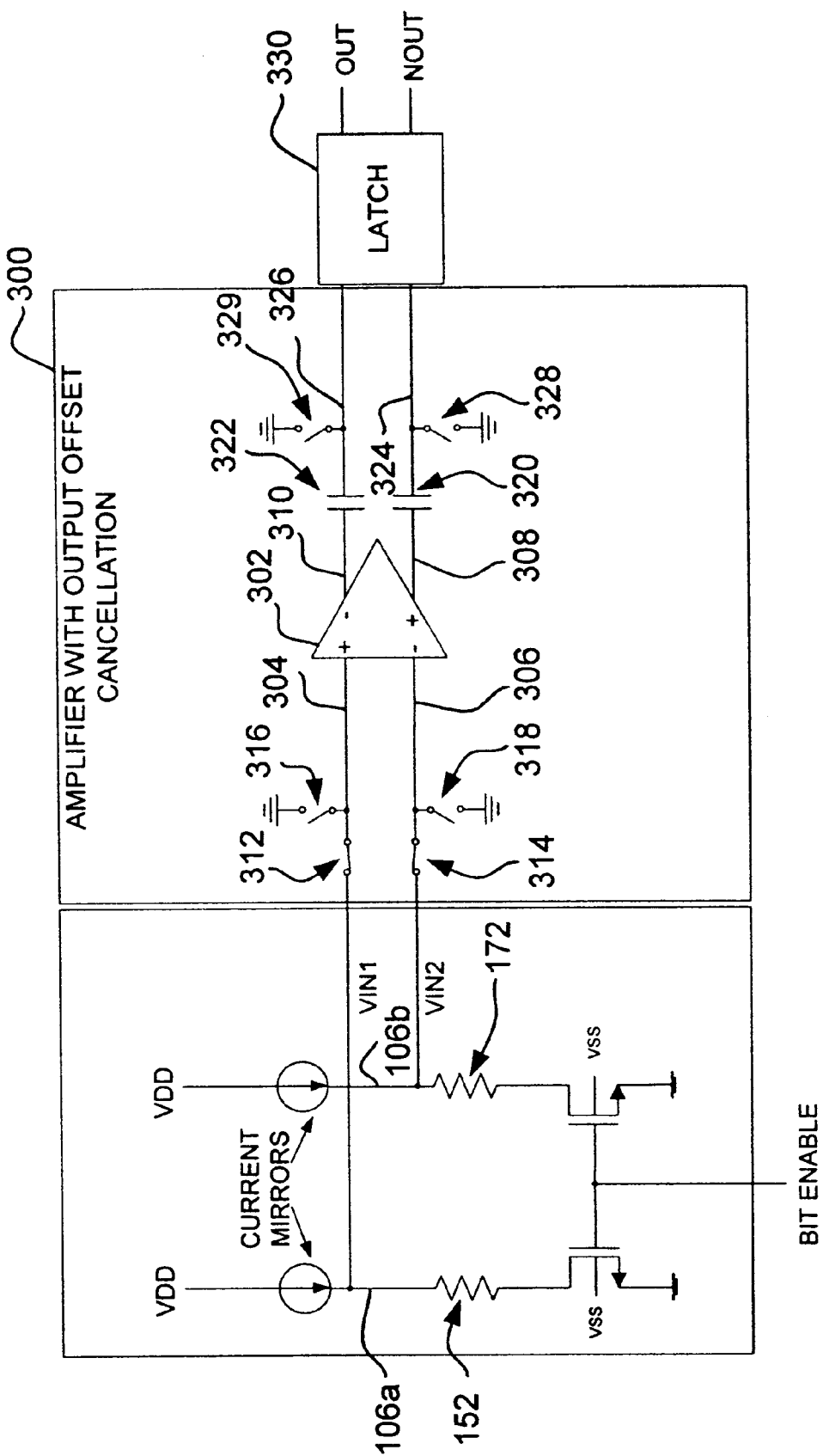
FIG. 7 is a schematic diagram showing a first illustrative sense amplifier in accordance with the present invention.

FIG. 7 is a schematic diagram showing a first illustrative sense amplifier in accordance with the present invention. As indicated above with respect to FIG. 1, it is often desirable to provide a sense amplifier between the selected bit lines and a corresponding latch. The use of a sense amplifier may allow lower sense currents to be used. The lower sense currents produce a smaller signal on the bit lines. This sense amplifier may amplify this smaller signal before providing the signal to the latch.

The illustrative sense amplifier is shown generally at 300, and includes offset cancellation to reduce or eliminate the internal offsets of the differential amplifier 302. The offset cancellation of the amplifier is preferably controlled by one or more switches, which during operation, selectively enable the offset cancellation of the amplifier and store the offsets in one or more coupling capacitors.

FIG. 7 shows a sense amplifier that uses output offset cancellation. That is, the offsets of the differential amplifier 302 are stored on one or more coupling capacitors that are coupled to the outputs of the differential amplifier 302. The differential amplifier includes a first input terminal 304, a second input terminal 306, a first output terminal 308 and a second output terminal 310. The first input terminal 304 is selectively coupled to a first bit line, such as first bit line 106a of FIG. 2, via switch 312. Likewise, the second input terminal 306 is selectively coupled to a second bit line, such as second bit line 106b of FIG. 2, via switch 314. The first input terminal 304 is also selectively coupled to a predetermined reference voltage such as ground via switch 316, and the second input terminal 306 is selectively coupled to the predetermined reference voltage such as ground via switch 318.

A first coupling capacitor 320 is coupled to the first output terminal 308 and a second coupling capacitor 322 is coupled to the second output terminal 310, as shown. The output 324 of the first coupling capacitor 320 is coupled to a first input of latch 330, and is further selectively coupled to a predetermined reference voltage such as ground via switch 328. Likewise, the output 326 of the second coupling capacitor 322 is coupled to a second input of latch 320, and is further coupled to a predetermined reference voltage such as ground via switch 329.

During offset cancellation, switches 316 and 318 are closed, thereby coupling the first input 304 and second input 306 to ground. Switches 328 and 329 are also closed, thereby coupling the output 324 of the first coupling capacitor 320 and the output 326 of the second coupling capacitor 322 to ground. Finally, switches 312 and 314 are opened to disconnect the first and second inputs 304 and 306 from the bit lines 106a and 106b. In this configuration, a charge is stored on the first and second coupling capacitors 320 and 322 that corresponds to the internal offsets of the differential amplifier 302.

Once the coupling capacitors are charged, the offset cancellation may be disabled. Disabling the offset cancellation opens switches 316, 318, 328 and 329, thereby disconnecting the outputs 324 and 326 of the coupling capacitors 320 and 322 from ground, and disconnecting the inputs 304 and 306 of the differential amplifier 302 from ground. Disabling the offset cancellation also closes switches 312 and 314, which connects the inputs 304 and 306 of the differential amplifier 302 to the first and second bit lines 106a and 106b. Because the internal offsets of the differential amplifier 302 are already stored on the coupling capacitors 320 and 322, the resulting output signal at the outputs 324 and 326 of the coupling capacitors 320 and 322 is substantially free of internal offsets, thereby allowing the reliable amplification of relatively small signal levels.

Instead of connecting the outputs 324 and 326 of the coupling capacitors 320 and 322 to a predetermined reference voltage such as ground during offset cancellation, it is contemplated that a differential voltage having the opposite polarity of the differential voltage generated between the first bit line 106a and the second bit line 106b may be provided to the outputs 324 and 326 of the coupling capacitors 320 and 322 via switches 328 and 329, respectively. The differential voltage having the opposite polarity of the differential voltage generated between the first bit line 106a and the second bit line 106b may also be provided to the inputs 304 and 306 of the differential amplifier 302 via switches 316 and 318, respectively.

This may cause the coupling capacitors 320 and 322 to store a charge that not only cancels out the internal offsets of the differential amplifier 302, but also includes a charge that corresponds to the opposite polarity of the desired differential signal. Once the offset cancellation is disabled, the differential voltage generated between the first and second bit lines 106a and 106b may be provided to the inputs 304 and 306 of the differential amplifier 302 via switches 312 and 314, respectively. This may produce about a two times amplification in the differential voltage, as seen at the outputs 324 and 326 of the coupling capacitors 320 and 322, thereby further increasing the ability of the sense amplifier to reliably amplify small signal levels.

The output of the sense amplifier is preferably provided to a latch 330, as shown. The latch 330 may store the data state read from the magneto-resistive memory cell. In an illustrative embodiment, the latch includes a pair of cross-coupled inverters, where each of the cross-coupled inverters has an input terminal, an output terminal, a power supply terminal and a ground terminal. A pair of switches are provided for selectively disconnecting the power supply terminal from a power supply voltage and/or the ground terminal from ground. The latch 330 may further include at least one switch for selectively connecting the output s 324 and 326 of the sense amplifier to the output terminals of the cross-coupled inverters. Finally, the illustrative latch may include a reset switch for selectively connecting together the output terminals of the cross-coupled inverters. One such latch is further described below with reference to FIG. 12.

Figure 8:
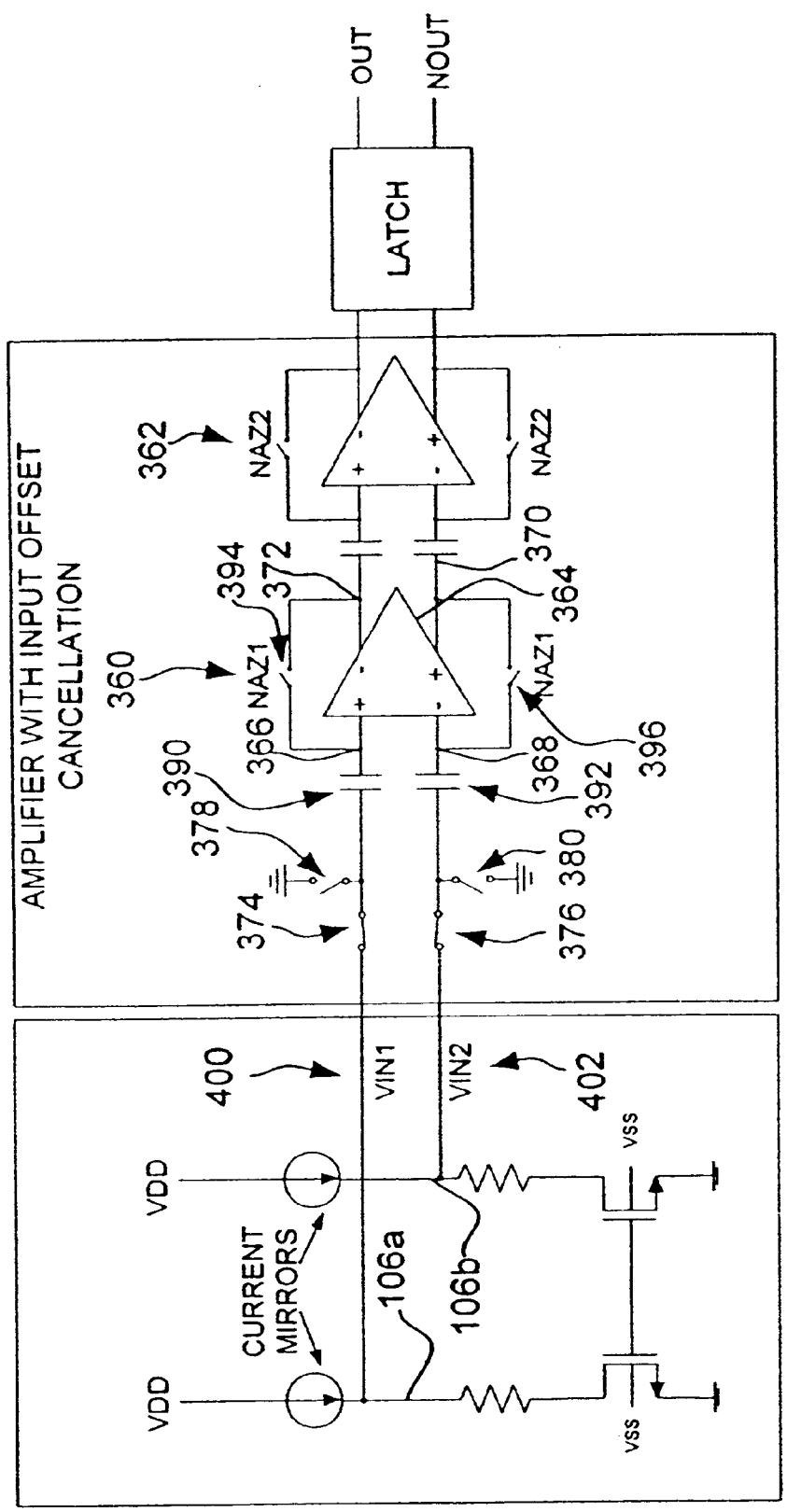
FIG. 8 is a schematic diagram showing a second illustrative sense amplifier in accordance with the present invention.

FIG. 8 is a schematic diagram showing a second illustrative sense amplifier in accordance with the present invention. A two stage sense amplifier is shown in FIG. 8, wherein each stage has input offset cancellation. Input offset cancellation indicates that the offsets of the amplifiers are stored on one or more coupling capacitors that are coupled to the inputs of each amplifier stage.

A first stage of the sense amplifier is shown at 360, and a second stage is shown at 362. The first stage includes a differential amplifier 364. Differential amplifier 364 includes a first input terminal 366, a second input terminal 368, a first output terminal 370 and a second output terminal 372. The first input terminal 366 is coupled to a first coupling capacitor 390, and is further selectively coupled to the second output terminal 372 via switch 394. Likewise, the second input terminal 368 is coupled to a second coupling capacitor 392, and is further selectively coupled to the first output terminal 370 via switch 396.

Input 400 of the first coupling capacitor 390 is selectively coupled to a first bit line, such as first bit line 106a of FIG. 2, via switch 374. Likewise, input 402 of the second coupling capacitor 392 is selectively coupled to a second bit line, such as second bit line 106b of FIG. 2, via switch 376. The input 400 of the first coupling capacitor 390 is also selectively coupled to a predetermined reference voltage such as ground via switch 378, and the input 402 of the second coupling capacitor 392 is selectively coupled to a predetermined reference voltage such as ground via switch 380.

During offset cancellation, switch 394 is closed to connect the first input 366 of the differential amplifier 364 to the second output 372 of the differential amplifier 364, and switch 396 is closed to connect the second input 368 of the differential amplifier 364 to the first output 370 of the differential amplifier. Switches 394 and 396 are often called auto-zero switches because they provide an effective "zero" input level at the input of the differential amplifier 364. The effective "zero" input level is not usually a zero value, but rather a value that corresponds to the internal offsets of the differential amplifier 364.

Switches 378 and 380 are also closed to connect the inputs 400 and 402 of coupling capacitors 390 and 392 to a predetermined reference voltage such as ground. Finally, switches 374 and 376 are opened, to disconnect the inputs 400 and 402 of coupling capacitors 390 and 392 from the first and second bit lines 106a and 106b. In this configuration, a charge is stored on the coupling capacitors 390 and 392 that corresponds to the internal offsets of the differential amplifier 364.

Once the coupling capacitors are charged, the offset cancellation is disabled. Disabling the offset cancellation opens switches 378, 380, 394 and 396, thereby disconnecting the inputs 400 and 402 of the coupling capacitors 390 and 392 from ground, and disconnecting the inputs 366 and 368 of the differential amplifier 364 from the outputs 370 and 372 of the differential amplifier 364. Disabling the offset cancellation also closes switches 374 and 376, which connects the inputs 400 and 402 of the coupling capacitors 390 and 392 to the first and second bit lines 106a and 106b.

Because the internal offsets of the differential amplifier 364 are already stored on the coupling capacitors 390 and 392, the resulting output signal of the differential amplifier 364 is substantially free of the internal offsets, thereby allowing the reliable amplification of relatively small signal levels. The second stage 362 operates in a similar manner.

Instead of connecting the inputs 400 and 402 of the first and second coupling capacitors 390 and 392, respectively, to a predetermined reference voltage during offset cancellation, it is contemplated that a differential voltage having the opposite polarity to the differential voltage between the first and second bit lines 106a and 106b may be provided to the coupling capacitors 390 and 392. This may cause the coupling capacitors 390 and 392 to store a charge that not only cancels out the internal offsets of the differential amplifier 364, but also includes a charge that corresponds to the opposite polarity of the desired differential voltage signal. Once the offset cancellation is disabled, the differential voltage generated between the first and second bit lines 106a and 106b is provided to the inputs 400 and 402 of the coupling capacitors 390 and 392. This embodiment may produce about a two times amplification in the differential voltage signal, as seen at the inputs 366 and 368 of the differential amplifier 364, thereby further increasing the ability of the sense amplifier to reliably amplify small signals.

Figure 9:
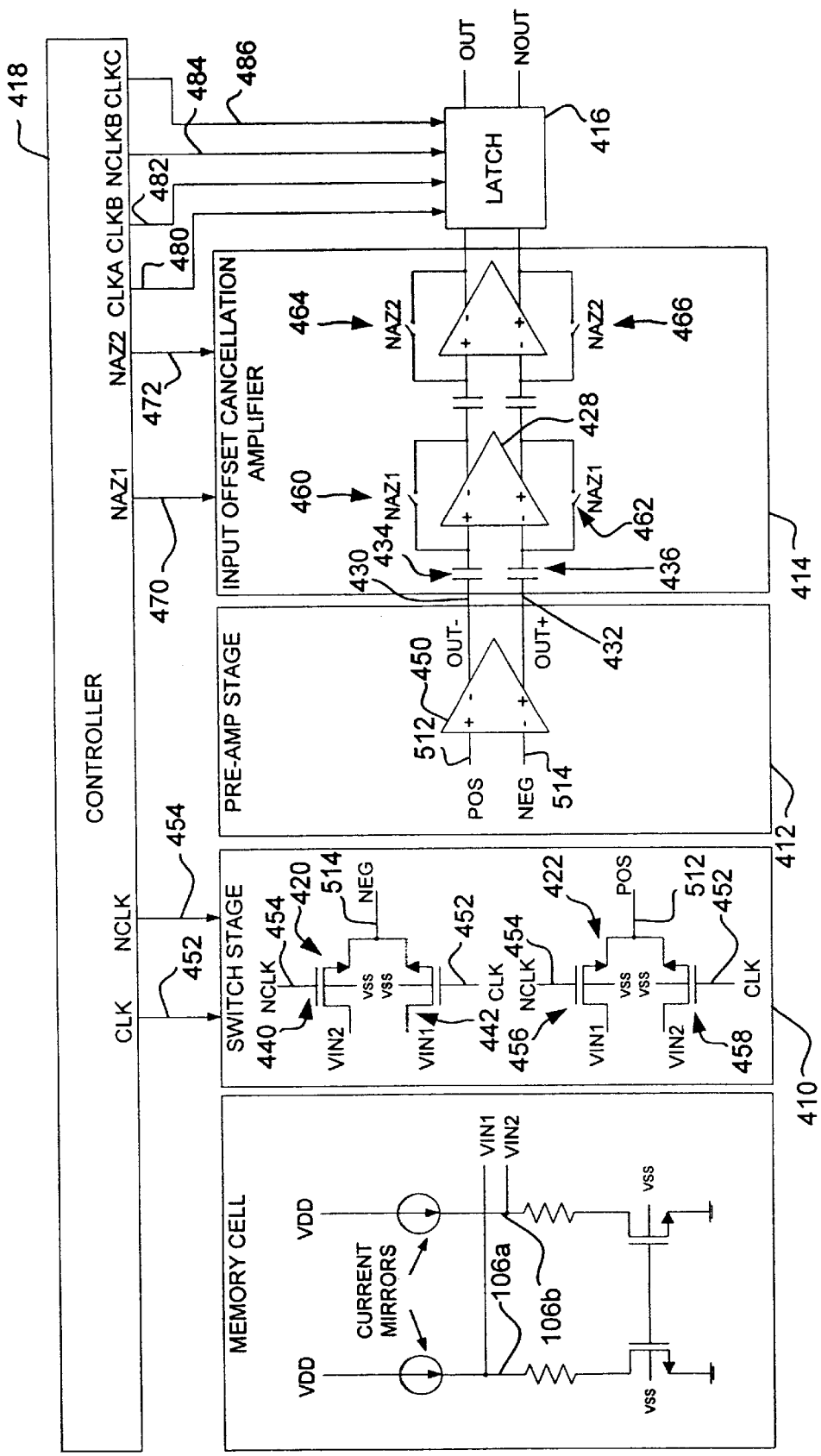
FIG. 9 is a schematic diagram showing a third illustrative sense amplifier in accordance with the present invention.

FIG. 9 is a schematic diagram showing a third illustrative sense amplifier in accordance with the present invention. This embodiment provides a differential voltage signal having the opposite polarity to the differential voltage between the first and second bit lines 106a and 106b to the coupling capacitors of the input offset cancellation amplifier 414 during offset cancellation. As indicated above, this may increase the amplification of the differential voltage signal, as seen at the inputs of the differential amplifier 428, which may further increasing the ability of the sense amplifier to reliably amplify small signals.

The illustrative sense amplifier includes a switch stage 410, a pre-amplifier stage 412, a two stage input offset cancellation amplifier 414, a latch 416 and a controller 418. The switch stage 410 includes two switching elements 420 and 422. The first switching element 420 includes two n-channel transistors 440 and 442, each having a source, a drain and a gate. The drain of n-channel transistor 442 is coupled to the first bit line 106a, and the drain of n-channel transistor 440 is coupled to the second bit line 106b. The source of n-channel transistor 440 is coupled to the source of n-channel transistor 442, both of which are coupled to the negative input terminal 514 of the differential amplifier 450. The gate of n-channel transistor 442 is controlled by a clock signal 452, and the gate of n-channel transistor 440 is controlled by an inverted clock signal 454. Thus, only one of the n-channel transistors 440 and 442 is on at any given time.

Like the first switching element 420, the second switching element 422 of the switch stage 410 includes two n-channel transistors 456 and 458, each having a source, a drain and a gate. The drain of n-channel transistor 456 is coupled to the first bit line 106a, and the drain of the n-channel transistor 458 is coupled to the second bit line 106b. The source of n-channel transistor 456 is coupled to the source of n-channel transistor 458, both of which are coupled to the positive input terminal 512 of the differential amplifier 450. The gate of n-channel transistor 456 is controlled by the inverted clock signal 454, and the gate of n-channel transistor 458 is controlled by the clock signal 452. Thus, only one of the n-channel transistors 456 and 458 is on at any given time.

When the clock signal 452 is high and the inverted clock signal 454 is low, the first switching element 420 provides the voltage on the first bit line 106a to the negative input terminal 514 of the differential amplifier 450 of the pre-amplifier stage 412. The second switching element 422 provides the voltage on the second bit line 106b to the positive input terminal 512 of the differential amplifier 450 of the pre-amplifier stage 412. When the clock signal 452 is low and the inverted clock signal 454 is high, the first switching element 420 provides the voltage on the second bit line 106b to the negative input terminal 514 of the differential amplifier 450 of the pre-amplifier stage 412. The second switching element 422 provides the voltage on the first bit line 106a to the positive input terminal 512 of the differential amplifier 450 of the pre-amplifier stage 412.

Accordingly, the switch stage 410 can be used to selectively change the polarity of the differential signal received from the first and second bit lines 106a and 106b, before providing the differential signal to the pre-amplifier stage 412. The pre-amplifier stage 412 amplifies the differential signal provided by the switch stage 410, and provides an amplified differential signal to the inputs 430 and 432 of coupling capacitors 434 and 436 of the input offset cancellation amplifier 414.

As such, and during offset cancellation, the inputs 430 and 432 of the first and second coupling capacitors 434 and 436 are coupled to a differential voltage having the opposite polarity of the differential signal between the first and second bit lines 106a and 106b. This causes the coupling capacitors 434 and 436 to store a charge that not only cancels out the internal offsets of the differential amplifier 428, but also includes a charge that corresponds to the opposite polarity of the desired differential voltage signal.

When the offset cancellation is disabled, the differential voltage between the first and second bit lines 106a and 106b is amplified by the pre-amplifier stage 412 and provided to the inputs 430 and 432 of the coupling capacitors 434 and 436. That is, the polarity of the differential signal at the inputs of the coupling capacitors 434 and 436 is reversed. This produces about a two times amplification in the differential voltage signal, as seen at the inputs of the differential amplifier 428, which may further increase the ability of the sense amplifier to reliably amplify small signals.

As with the embodiment of FIG. 8, auto-zero switches 460, 462, 464 and 466 are preferably closed during offset cancellation, and opened after offset cancellation is disabled. Switches 460 and 462 are preferably controlled by NAZ1 470, and switches 464 and 466 are preferably controlled by NAZ2 472. The output of the input offset cancellation amplifier 414 is provided to a latch 416. Latch 416 receives a number or control signals, including CLK-A 480, CLK-B 482, NCLK-B 484 and CLK-C 486, all of which are more fully described below with respect to FIGS. 12–13.

Figure 10:
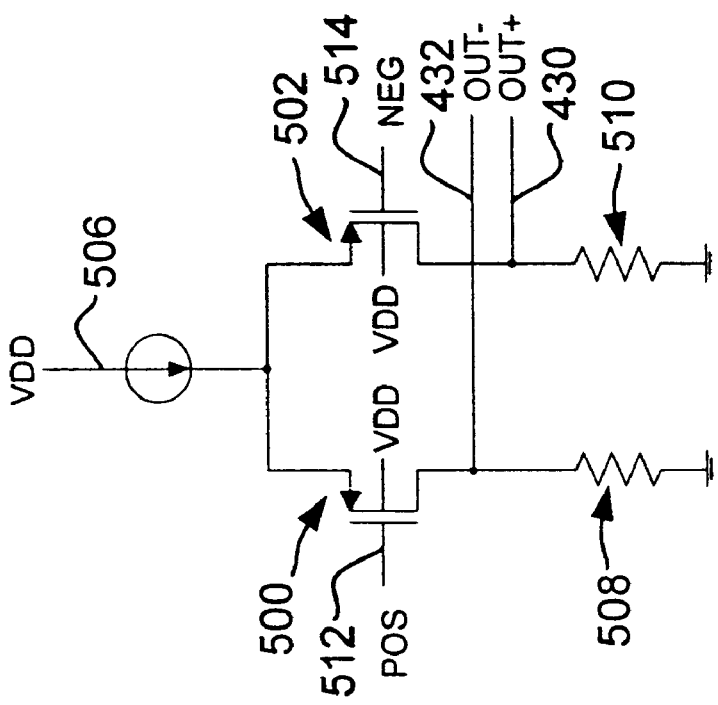
FIG. 10 is a schematic diagram showing the pre-amplifier stage-2 of the sense amplifier of FIG. 9.

FIG. 10 is a schematic diagram showing an illustrative pre-amplifier stage 412 for the sense amplifier of FIG. 9. The illustrative pre-amplifier stage 412 includes two p-channel transistors 500 and 502, a current source 506, and two resistors 508 and 510. The gate of the first p-channel transistor 500 is coupled to the positive input terminal 512 of the pre-amplifier stage 412, and the gate of the second p-channel transistor 502 is coupled to the negative input terminal 514. The source of the first p-channel transistor 500 and the source of the second p-channel transistor 502 are both coupled to the output of current source 506. Thus, the first p-channel transistor 500 and the second p-channel transistor 502 operate as a current divider.

The drain of the first p-channel transistor 500 is coupled to ground through resistor 508, and the drain of the second p-channel transistor 502 is coupled to ground through resistor 510. If the voltage at the gate of the first p-channel transistor 500 is lower than at the gate of the second p-channel transistor 502, more of the current provided by the current source 506 flows through resistor 508, thereby resulting in a higher voltage on the negative output terminal 432 than on the positive output terminal 430. Likewise, if the voltage at the gate of the first p-channel transistor 500 is higher than voltage at the gate of the second p-channel transistor 502, more of the current provided by the current source 506 flows through resistor 510, thereby resulting in a higher voltage on the positive output terminal 430 than on the negative output terminal 432. The gain of the amplifier may be set by choosing appropriate resistive values for resistors 508 and 510.

Figure 11:
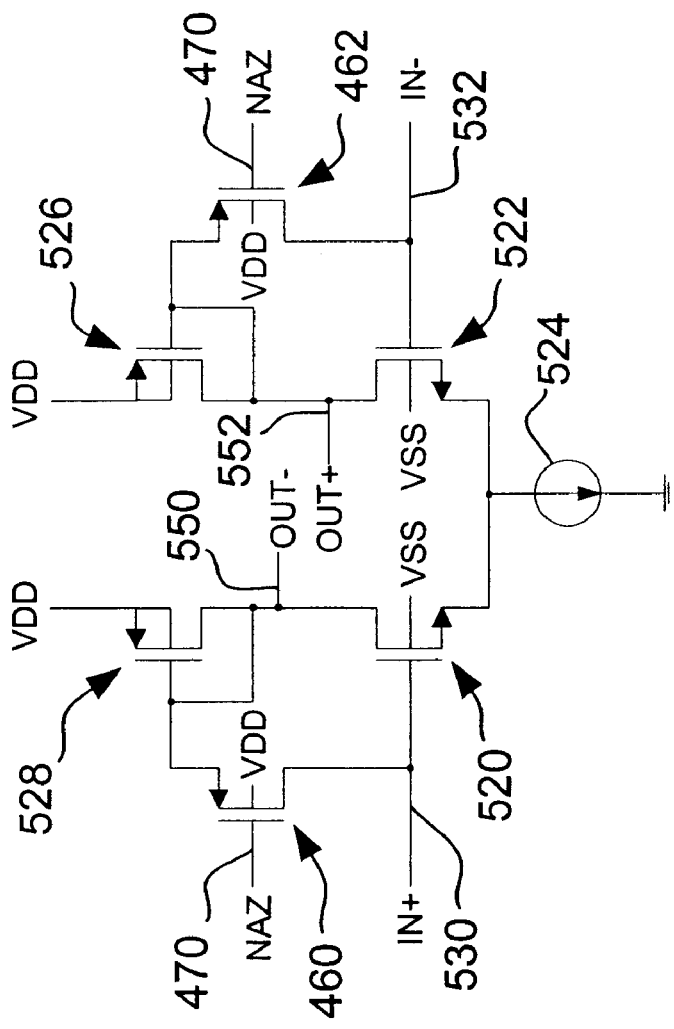
FIG. 11 is a schematic diagram showing one of the offset cancellation amplifier stages of the sense amplifier of FIG. 9.

FIG. 11 is a schematic diagram showing one of the offset cancellation amplifiers stages of the sense amplifier of FIG. 9. The illustrative offset cancellation amplifier stage includes two n-channel transistors 520 and 522, each having a source, a drain and a gate. The gate of n-channel transistor 520 is coupled to the positive input terminal 530, and the gate of n-channel transistor 522 is coupled to the negative input terminal 532. The sources of n-channel transistors 520 and 522 are both coupled to a current source 524. Thus, n-channel transistor 520 and n-channel transistor 522 operate as a current divider.

The drain of n-channel transistor 520 is connected to a p-channel transistor 528, which is configured as a diode load. Likewise, the drain of n-channel transistor 522 is connected to a p-channel transistor 526, which is also configured as a diode load. A first switch, which is implemented as p-channel transistor 460, shorts the negative output terminal 550 to the positive input terminal 530 when NAZ 470 is low. A second switch, which is implemented as p-channel transistor 462, shorts the positive output terminal 552 to the negative input terminal 532 when NAZ 470 is low. The differential gain of the amplifier may be adjusted by controlling the W/L ratios of the n-channel input pair and the p-channel load pair.

Figure 12:
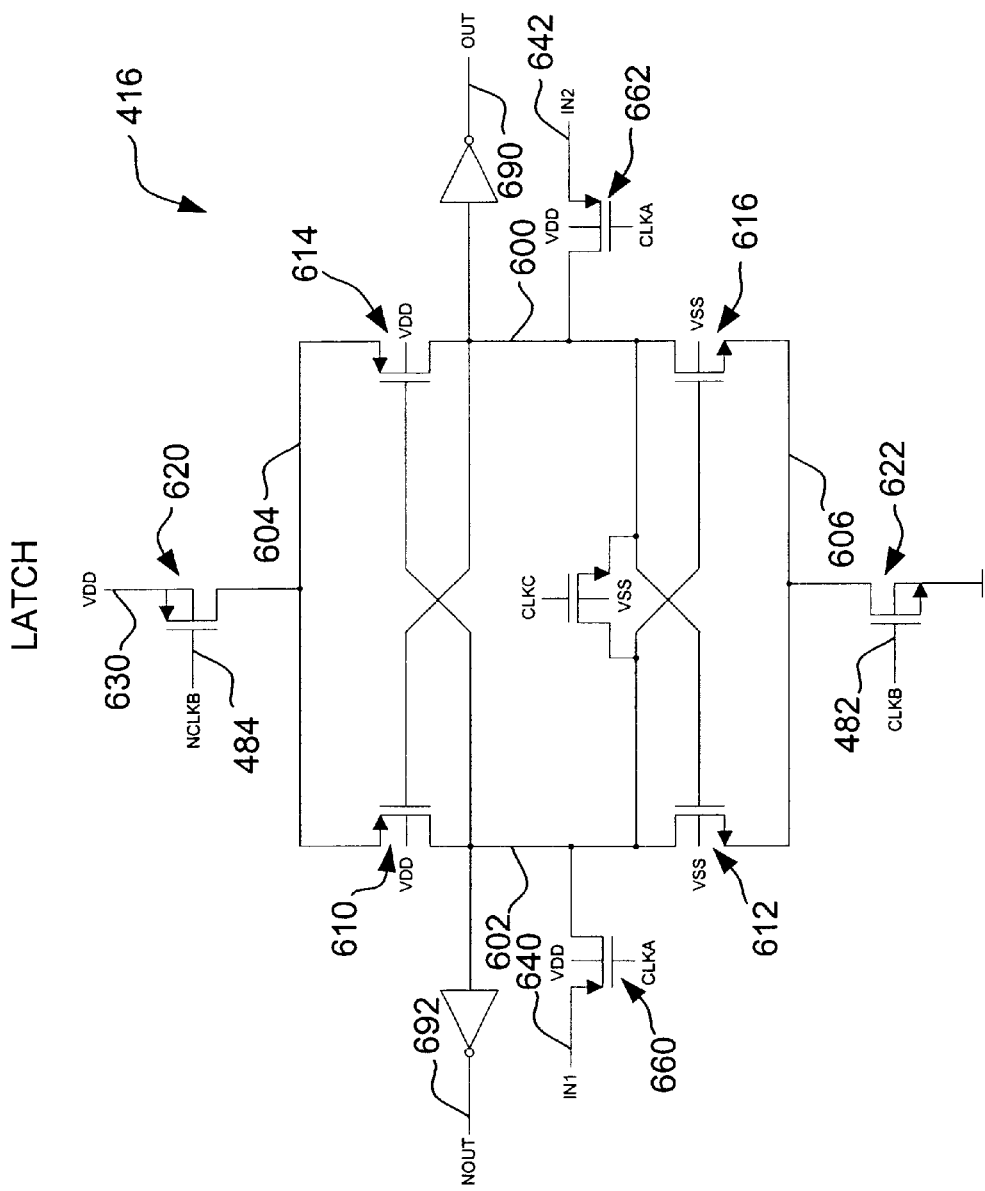
FIG. 12 is a schematic diagram showing an illustrative latch for use with the sense amplifier of FIG. 9.

FIG. 12 is a schematic diagram showing an illustrative latch for use with the sense amplifier of FIG. 9. The latch includes a pair of cross-coupled inverters. A first cross-coupled inverter includes p-channel transistor 610 and n-channel transistor 612 connected in series. The first cross-coupled inverter has an input terminal 600, an output terminal 602, a power supply terminal 604 and a ground terminal 606. A second cross-coupled inverter includes p-channel transistor 614 and n-channel transistor 616 connected in series. The second cross-coupled inverter has an input terminal 602, an output terminal 600, a power supply terminal 604 and a ground terminal 606.

A first switch 620 is provided for selectively disconnecting the power supply terminal 604 from the power supply voltage 630, and a second switch 622 is provided for selectively disconnecting the ground terminal 606 from ground. The first switch 620, which is shown as a p-channel transistor, is controlled by the NCLK-B signal 484. The second switch 622, which is shown as an n-channel transistor, is controlled by the CLK-B signal. Accordingly, the first switch 620 and the second switch 622 are either both open or both closed.

The illustrative latch further includes a switch 660 for selectively connecting the first input terminal IN1 640 to internal node 602 of the cross-coupled inverters, and another switch 662 for selectively connecting the second input terminal IN2 642 to internal node 600 of the cross-coupled inverters. Switch 660 and switch 662 are selectively enabled to allow the output signal of the sense amplifier of FIG. 9 to set the state of the latch 416. Finally, the illustrative latch includes a reset switch 670 for selectively connecting the output terminals 600 and 602 of the cross-coupled inverters.

During operation, control block 418 of FIG. 9 selectively disconnects the power supply terminal 604 and the ground terminal 606 (collectively called the power supply terminals) the cross-coupled inverters. The control block 418 then enables switches 660 and 662 via the CLK-A signal, which allows the output signal of the sense amplifier to set the voltage levels of internal nodes 600 and 602. The control block 418 then disables switches 660 and 662 to prevent the latch from inadvertently driving the outputs of the sense amplifier when the power supply terminals of the cross-coupled inverters are connected. The control block 418 then connects the power supply terminals 604 and 606 of the cross-coupled inverters of the latch 416, which sets the latch 416 to the desired state. The desired state is then read from the latch via output terminals 690 and 692. The control block 418 then disconnects the power supply terminals 604 and 606. Finally, the control block 418 resets the state of the latch by selectively connecting the output terminals 600 and 602 of the cross-coupled inverters via the reset switch 670. A further discussion of the operation of the latch is provided below with respect to FIG. 13.

Figure 13:
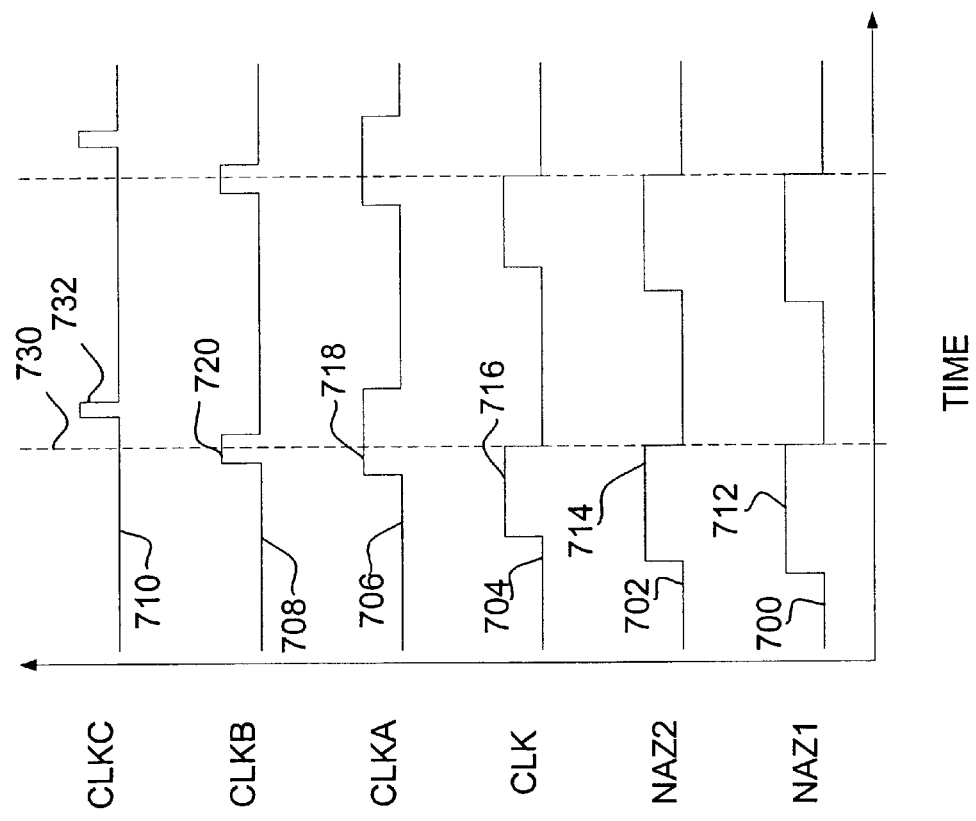
FIG. 13 is an illustrative timing diagram for the sense amplifier of FIG. 9.

FIG. 13 is an illustrative timing diagram for the sense amplifier of FIG. 9. This timing diagram should be read in conjunction with FIGS. 9-12. Initially, NAZ1 470 and NAZ2 472 are low, as shown at 700 and 702. This indicates that the offset cancellation is enabled for each of the stages of the input offset cancellation amplifier 414. The NAZ1 signal 470 and NAZ2 signal 472, when low, close switches 460, 462, 464 and 466 of FIG. 9. As indicated above, switches 460, 462, 464 and 466 connect the input terminals of the corresponding differential amplifiers to the output terminals.

The CLK signal 452 is low and thus NCLK 454 is high, as shown at 704. When CLK 452 is high and NCLK 454 is low, the switch stage 410 changes the polarity of the differential signal received from the first and second bit lines 106a and 106b, before providing the differential signal to the pre-amplifier stage 412. The pre-amplifier stage 412 amplifies the differential signal provided by the switch stage 410, and provides an amplified differential signal to the inputs 430 and 432 of coupling capacitors 434 and 436 of the input offset cancellation amplifier 414.

As such, the inputs 430 and 432 of the first and second coupling capacitors 434 and 436, respectively, are coupled to a differential voltage having the opposite polarity of the differential signal between the first and second bit lines 106a and 106b. This causes the coupling capacitors 434 and 436 to store a charge that not only cancels out the internal offsets of the differential amplifier 428, but also includes a charge that corresponds to the opposite polarity of the desired differential voltage signal.

Control block 418 also sets CLK-A 480, CLK-B 482 and CLK-C 486 low, as shown at 706, 708 and 710, respectively.

By setting CLK-A 480 low, the switch transistors 660 and 662 of latch 416 are on, thereby connecting the outputs of the sense amplifier to the internal nodes 600 and 602 of the latch 416. By setting CLK-B 482 low, the switch transistors 620 and 622 of latch 416 are off, which disconnects the power supply terminals 604 and 606 of the latch 416 from the power supply voltage and ground. Finally, by setting CLK-C 486 low, the reset transistor 670 is off.

Once the coupling capacitors are charged, NAZ1 470 and NAZ2 472 are set high, as shown at 712 and 714. This indicates that the offset cancellation is disabled for each of the stages of the input offset cancellation amplifier 414. NAZ1 470 and NAZ2 472 when high, open switches 460, 462, 464 and 466, which disconnect the input terminals of the corresponding differential amplifiers from the output terminals.

The control block 418 then sets CLK 452 high, and thus NCLK 454 low. This is shown at 716. It is contemplated that the control block 418 may set CLK 452 high either before, during, or after NAZ1 470 and NAZ2 472 are set high. In any event, when CLK 452 is low and NCLK 454 is high, the switch stage 410 provides the differential signal received from the first and second bit lines 106a and 106b to the pre-amplifier stage 412. That is, the polarity of the differential signal at the inputs of the coupling capacitors 434 and 436 is reversed. This produces about a two times amplification in the differential voltage signal, as seen at the inputs of the differential amplifier 428, which may further increase the ability of the sense amplifier to reliably amplify small signals. The pre-amplifier stage 412 amplifies the differential signal provided by the switch stage 410, and provides an amplified differential signal to the inputs 430 and 432 of coupling capacitors 434 and 436 of the input offset cancellation amplifier 414.

Because CLK-A 480 remains low, the offset cancellation amplifier 414 is allowed to the set the voltage at internal nodes 600 and 602 of latch 416. Once this is complete, the control block 418 causes CLK-A 480 to go high, as shown at 718. This disconnects the internal nodes 600 and 602 from the sense amplifier. Thereafter, the control block 418 asserts CLK-B 482, as shown at 720. This turns on switches 620 and 622 of latch 416, which connects the power supply terminals 604 and 606 of the latch 416 to the power supply voltage and ground. When power is applied to the latch 416, the latch assumes the desired state.

Thereafter, the state of the latch is read, preferably at time 730. Once read, the control block 418 sets CLK-B 482 low, which turns off switches 620 and 622 of latch 416 and disconnects the power supply terminals 604 and 606 of the latch 416. The control block 418 also sets CLK-A 480 low, which disconnects the internal nodes 600 and 602 from the sense amplifier. Finally, the control block 418 sets CLK-C 486 high, as shown at 732. This turns on reset switch 670. Reset switch 670 shorts the internal nodes 600 and 602 together, thereby setting the latch into a neutral state in preparation for the next read cycle.

Having thus described the preferred embodiments of the present invention, those of skill in the art will readily appreciate that the teachings found herein may be applied to yet other embodiments within the scope of the claims hereto attached.

What is claimed is:

1. A magneto-resistive memory cell, comprising:
   a first magneto-resistive bit having a first end and a second end;
   a first bit line connected to the first end of the first magneto-resistive bit;

first switching means coupled to the second end of the first magneto-resistive bit for selectively providing a path for a first sense current to flow from the first bit line, through at least part of the first magneto-resistive bit, and to a first predetermined voltage terminal that is coupled to ground;

a second magneto-resistive bit having a first end and a second end;

a second bit line connected to the first end of the second magneto-resistive bit;

second switching means coupled to the second end of the second magneto-resistive bit for selectively providing a path for a second sense current to flow from the second bit line, through at least part of the second magneto-resistive bit, and to a second predetermined voltage terminal; and writing means for writing the first magneto-resistive bit into a different resistive state than the second magneto-resistive bit.

2. A magneto-resistive memory cell according to claim 1, wherein the writing means includes a first word line extending adjacent the first magneto-resistive bit and a second word line extending adjacent the second magneto-resistive bit.

3. A magneto-resistive memory cell according to claim 2, wherein the writing means provides a first word line current to the first word line and a second word line current to the second word line such that the first magneto-resistive bit and the second magneto-resistive bit are written into opposite resistive states.

4. A magneto-resistive memory cell according to claim 1, wherein the writing means includes a word line that extends over the first magneto-resistive bit and under the second magneto-resistive bit.

5. A magneto-resistive memory comprising:

latching means including a first inverter and a second inverter coupled together in a cross-coupled configuration, each of the first and second inverters having a positive supply terminal, a negative supply terminal, an input terminal and an output terminal, the positive supply terminal of the first and second inverters being coupled to a power supply voltage;

the latching means further including a load transistor for loading a state into the latch means, the load transistor having a source terminal coupled to the input terminal of the first inverter, a drain terminal coupled to the input terminal of the second inverter, and a gate terminal coupled to a load enable terminal;

two or more magneto-resistive memory cells arranged in a first column, each of the magneto-resistive memory cells in the first column having a first magneto-resistive bit with a first end and a second end, and a second magneto-resistive bit with a first end and a second end, each of the magneto-resistive memory cells in the first column also have switching means for selectively coupling the second end of the first magneto-resistive bit and the second end of the second magneto-resistive bit to a predetermined reference voltage;

a first bit line coupled to a first predetermined node of the first inverter, and further coupled to the first end of the first magneto-resistive bit of each of the magneto-resistive memory cells in the first column; and a second bit line coupled to a second predetermined node of the second inverter, and further coupled to the first end of the second magneto-resistive bit of each of the magneto-resistive memory cells in the first column.

6. A magneto-resistive memory according to claim 5, wherein the first predetermined node of the first inverter is the input terminal of the first inverter.

7. A magneto-resistive memory according to claim 6, wherein the first bit line is coupled to the input of the first inverter through a switch.

8. A magneto-resistive memory according to claim 7, wherein the switch is a transistor.

9. A magneto-resistive memory according to claim 5, wherein the predetermined node of the first inverter is the negative supply terminal of the first inverter.

10. A magneto-resistive memory according to claim 5, wherein the second predetermined node of the second inverter is the input terminal of the second inverter.

11. A magneto-resistive memory according to claim 10, wherein the second bit line is coupled to the input of the second inverter through a switch.

12. A magneto-resistive memory according to claim 11, wherein the switch is a transistor.

13. A magneto-resistive memory according to claim 5, wherein the second predetermined node of the second inverter is the negative supply terminal of the second inverter.

14. A magneto-resistive memory according to claim 5, further comprising a differential amplifier, wherein the first bit line and the second bit line of the first column are coupled to the first predetermined node of the first inverter and the second predetermined node of the second inverter, respectively, through the differential amplifier.

15. A magneto-resistive memory according to claim 14, wherein the differential amplifier has a first input, a second input, a first output and a second output, the first input and the second input are coupled to the first and second bit lines of the first column, respectively, and the first output and the second output are coupled to the first and second predetermined nodes of the latching means, respectively.

16. A magneto-resistive memory according to claim 5, further comprising first decoding means for selectively enabling the switching means of a selected one of the magneto-resistive memory cells in the first column.

17. A magneto-resistive memory according to claim 16, further comprising:

two or more magneto-resistive memory cells arranged into one or more additional columns, each of the magneto-resistive memory cells in each of the additional columns having a first magneto-resistive bit with a first end and a second end, and a second magneto-resistive bit with a first end and a second end, each of the magneto-resistive memory cells in the additional columns also having switching means for selectively coupling the second end of the first magneto-resistive bit and the second end of the second magneto-resistive bit to a predetermined reference voltage;

each of the additional columns having a corresponding first bit line coupled to the first end of the first magneto-resistive bit of each of the magneto-resistive memory cells in the column, and a second bit line coupled to the first end of the second magneto-resistive bit of each of the magneto-resistive memory cells in the column; and second decoding means for selectively coupling the first and second bit lines of a selected column to the first and second predetermined nodes of the latching means.

18. A magneto-resistive memory according to claim 17, wherein the first decoding means selectively enables the switching means of a selected one of the magneto-resistive memory cells in each of the columns.

19. A magneto-resistive memory according to claim 18, wherein the first and second decoding means are controlled by a memory address.

20. A magneto-resistive memory according to claim 17, further comprising a differential amplifier means having a first input, a second input, a first output and a second output, the first input and the second input are coupled to the first and second bit lines of the selected column via the second decoding means, and the first output and the second output are coupled to the first and second predetermined nodes, respectively, of the latching means.

21. A method for reading the state of a magneto-resistive memory cell having a first magneto-resistive bit with a first end and a second end and a second magneto-resistive bit with a first end and a second end, the second end of the first magneto-resistive bit and the second end of the second magneto-resistive bit are selectively coupled to a predetermined reference voltage via a switching means, and the first end of the first magneto-resistive bit is coupled to a first bit line and the first end of the second magneto-resistive bit is coupled to a second bit line, the method comprising the steps of:

providing a sense current to the first bit line and the second bit line;

enabling the switching means for selectively coupling the second end of the first magneto-resistive bit and the second end of the second magneto-resistive bit to the predetermined reference voltage, thereby drawing at least a portion of the sense current through the first magneto-resistive bit and the second magneto-resistive bit; and sensing the voltage difference between the first bit line and the second bit line.

22. A method according to claim 21, further comprising the step of amplifying the sensed voltage difference.

23. A method according to claim 21, further comprising the step of providing the sensed voltage difference to a latching means.

24. A method according to claim 21, further comprising the steps of:

amplifying the sensed voltage difference, thereby providing an amplified voltage difference; and providing the amplified voltage difference to a latching means.

25. A method according to claim 21, where in the sense current is provided before the switching means is enabled.

26. A method according to claim 21, wherein the sense current is provided after the switching means is enabled.

* * * * *

UNITED STATES PATENT AND TRADEMARK OFFICE
CERTIFICATE OF CORRECTION

PATENT NO.   : 6,493,258 B1
DATED        : December 10, 2002
INVENTOR(S)  : Yong Lu, Theodore Zhu and Romney R. Katti It is certified that error appears in the above-identified patent and that said Letters Patent is hereby corrected as shown below:

<u>Column 1,</u>
Line 2, please add the following paragraph:

-- This invention was made with Government support under Contract Number MDA972-98-C-0021 awarded by DARPA. The Government has certain rights in this invention. --

Signed and Sealed this

Eighth Day of July, 2003

JAMES E. ROGAN
*Director of the United States Patent and Trademark Office*